US008994477B2

(12) United States Patent
Wu et al.

(10) Patent No.: US 8,994,477 B2
(45) Date of Patent: Mar. 31, 2015

(54) NOISE FILTERING CIRCUIT FOR SUPPRESSING EMI

(75) Inventors: Tzong-Lin Wu, Taipei (TW); Iat-In Ao-Ieong, Taipei (TW)

(73) Assignee: National Taiwan University, Taipei (TW)

( * ) Notice: Subject to any disclaimer, the term of this patent is extended or adjusted under 35 U.S.C. 154(b) by 415 days.

(21) Appl. No.: 13/443,135

(22) Filed: Apr. 10, 2012

(65) Prior Publication Data

US 2012/0262251 A1    Oct. 18, 2012

(30) Foreign Application Priority Data

Apr. 15, 2011   (TW) .............................. 100113139 A

(51) Int. Cl.
| | |
|---|---|
| H03H 7/09 | (2006.01) |
| H01P 1/203 | (2006.01) |
| H03H 7/01 | (2006.01) |
| H03H 1/00 | (2006.01) |
| H01F 17/00 | (2006.01) |

(52) U.S. Cl.
CPC .... H01P 1/20345 (2013.01); *H03H 2001/0085* (2013.01); H03H 7/0115 (2013.01); H03H 7/09 (2013.01); *H01F 2017/0026* (2013.01)
USPC ........................................... 333/185; 333/12

(58) Field of Classification Search
CPC ................... H03H 2001/0085; H03H 1/0007; H03H 7/0115; H03H 7/06; H03H 7/09
USPC ............................................ 333/12, 181, 185
See application file for complete search history.

(56) References Cited

U.S. PATENT DOCUMENTS

| | | | | |
|---|---|---|---|---|
| 5,812,384 | A | * | 9/1998 | Ramakrishnan et al. ........ 363/39 |
| 7,652,476 | B2 | * | 1/2010 | de Rooij et al. ............... 324/322 |
| 7,932,793 | B2 | * | 4/2011 | Wu et al. ....................... 333/204 |
| 7,956,704 | B1 | * | 6/2011 | Acimovic ...................... 333/181 |
| 8,044,746 | B2 | * | 10/2011 | Blair et al. ......................... 333/5 |
| 2008/0186106 | A1 | * | 8/2008 | Christian et al. .............. 333/133 |
| 2010/0188169 | A1 | * | 7/2010 | Hossain et al. ............... 333/175 |
| 2011/0025434 | A1 | * | 2/2011 | Hsieh et al. ................... 333/204 |

* cited by examiner

*Primary Examiner* — Benny Lee
*Assistant Examiner* — Rakesh Patel
(74) *Attorney, Agent, or Firm* — Bacon & Thomas, PLLC

(57) ABSTRACT

A noise filtering circuit for suppressing electromagnetic interference (EMI) is provided. The noise filtering circuit filters out high multiplied-frequency noise of a digital signal being transmitted and includes a reference voltage structure formed from conductors, a signal transmitting structure formed from a transmission conductor, a ground layer, and a ground structure electrically connected to the reference voltage structure and the ground layer. The ground structure is configured to form an inductor-capacitor oscillating structure in coordination with the electric-magnetical coupling between the reference voltage structure and the signal transmitting structure as well as the inductance of the ground structure, so that a digital signal is filtered out at a specific frequency and the passband of the digital signal can be transmitted.

24 Claims, 19 Drawing Sheets

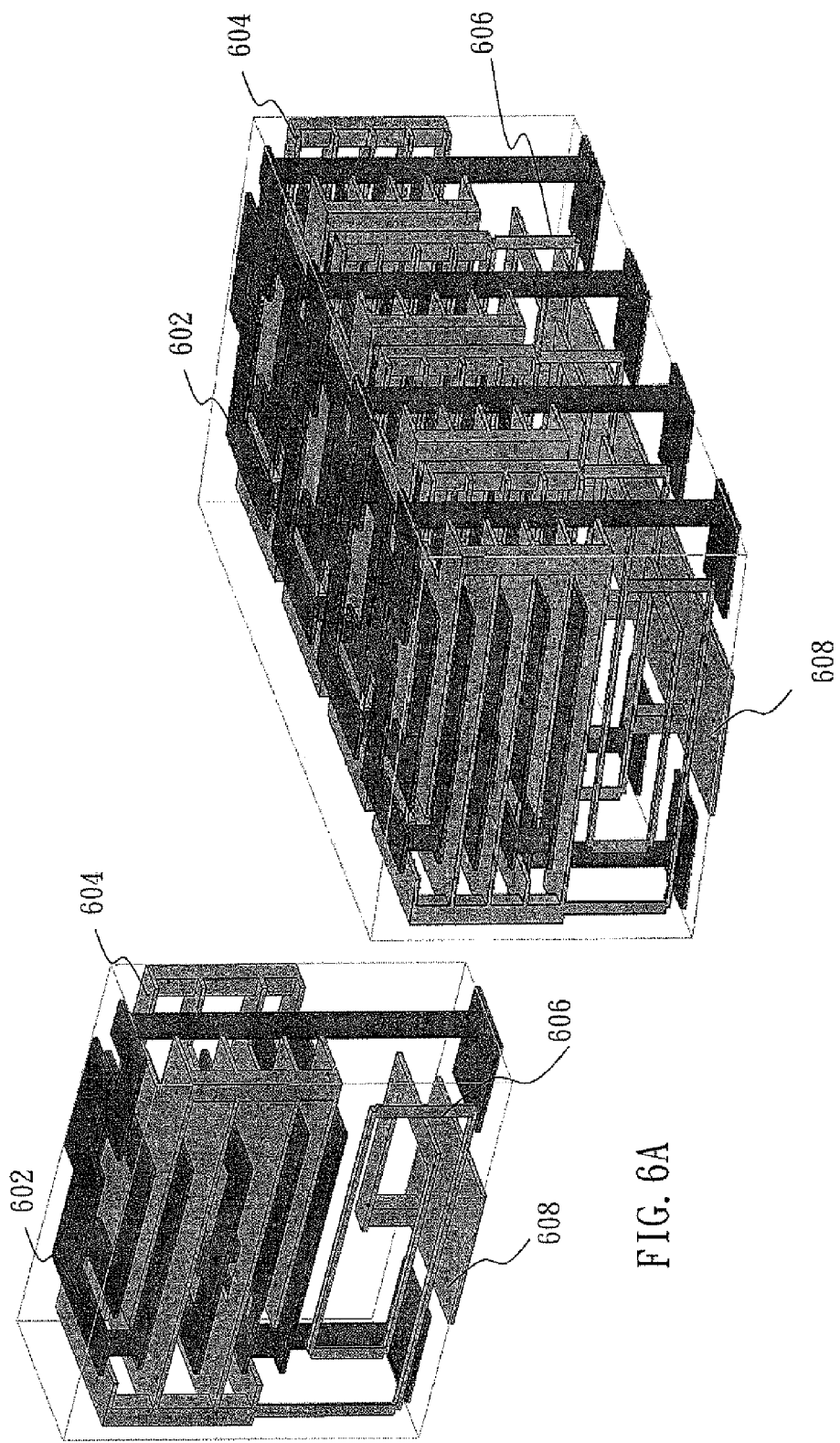

NOISE FILTERING CIRCUIT FOR SUPPRESSING EMI

BACKGROUND OF THE INVENTION

1. Field of the Invention

The present invention relates to noise filtering circuits for suppressing electromagnetic interference (EMI), and more particularly, to a noise filtering circuit for filtering out a high multiplied-frequency component of a high-speed digital signal within a broadband frequency band and enabling transmission of a passband of the digital signal.

2. Description of the Prior Art

The operation speed and clock frequency of a high-speed digital circuit increases with the rapid development of consumer electronic product. The faster a digital signal is, the broader the distribution of its frequency domain components is. However, in practical electronic circuit design, asymmetry is inevitable. For example, to minimize the occupied area of a delay line, a meandered line is arranged in the form of bending, penetrating a via, or becoming discrete in order to give way to a via. Regarding the meandered lines, electromagnetic interference (EMI) usually arises from the high multiplied-frequency component of a signal passing through the discrete structures or being sent to a connected wire or metallic shield, and as a result issues pertaining to severe electromagnetic compatibility and EMI confront related products.

In view of this, some methods for filtering out a high multiplied-frequency component of a signal were put forth. Among the methods, the most typical one involves ferrite beads/toroid choke, that is, blocking the high multiplied-frequency component of the signal by the high inductance of a ferromagnet. However, due to rapid attenuation of the magnetic permeability of the ferromagnet at a high frequency, the ferrite beads/toroid choke are actually inapplicable to a high-frequency signal operating at GHz-level frequencies. Furthermore, due to its large dimensions, the aforesaid structure is inapplicable to a high-speed digital circuit.

Surface mount devices (SMD) available on an industrial scale nowadays are miniaturized structures designed in accordance with the prototype of a T-section or pi-section low-pass filter. However, the miniaturized filter structures require large series-connected inductance and bypass capacitance, as far as their design is concerned, thereby incurring high design costs.

Accordingly, it is imperative to provide a noise filtering circuit conducive to elimination of the aforesaid drawbacks of the prior art, such as narrow application and high design costs.

SUMMARY OF THE INVENTION

In view of the aforesaid drawbacks of the prior art, it is an objective of the present invention to provide a noise filtering circuit. The noise filtering circuit embodies a resonant structure formed as a result of electromagnetic coupling and ground equivalent inductance, and comprises a noise filtering element for maintaining a low loss of a master signal. The noise filtering circuit is effective in suppressing the high multiplied-frequency component of the digital signal and enabling the transmission of the passband of the digital signal.

To implement the aforesaid concept, the present invention provides a noise filtering circuit for suppressing electromagnetic interference (EMI) by filtering out high frequency multiplied noise during transmission of a digital signal. The noise filtering circuit comprises: a reference voltage structure formed from conductors; a transmission conductor adapted to transmit the digital signal, combined with the reference voltage structure to effectuate electromagnetic coupling, and combined with the reference voltage structure to effectuate electromagnetic coupling, thereby developing transmission line characteristics during the transmission of the digital signal to allow transmission of a passband of master signal to remain unaffected; a ground layer electrically connected to a ground voltage; and a ground structure electrically connected to the reference voltage structure and the ground layer and configured to form an inductor-capacitor oscillating structure in coordination with the electromagnetic coupling between the reference voltage structure and the transmission conductor as well as inductance of the ground structure, so as to perform noise filtration on the digital signal at a specific frequency and suppress EMI.

Based on the aforesaid concept, the present invention further provides a noise filtering circuit for filtering out high frequency multiplied noise during transmission of a digital signal. The noise filtering circuit comprises: a reference voltage structure formed from conductors; a transmission conductor adapted to transmit the digital signal, combined with the reference voltage structure to effectuate electromagnetic coupling, and combined with the reference voltage structure to effectuate electromagnetic coupling, thereby developing transmission line characteristics during the transmission of the digital signal to allow transmission of the signal to remain unaffected; a ground layer electrically connected to a ground voltage; and a ground structure electrically connected to the reference voltage structure and the ground layer and configured to form an inductor-capacitor oscillating structure in coordination with the electromagnetic coupling between the reference voltage structure and the transmission conductor as well as inductance of the ground structure, so as to perform noise filtration on the digital signal at a specific frequency and enable transmission of the passband of the digital signal. The inductor-capacitor oscillating structure undergoes series-connection resonance at a first specific frequency and forms low impedance toward an unwanted component of the digital signal such that the unwanted component of the digital signal is guided to the ground voltage, and forms a first zero at the first specific frequency. The inductor-capacitor oscillating structure undergoes parallel-connection resonance at a second specific frequency and forms high impedance toward an unwanted component of the digital signal such that the unwanted component of the digital signal is guided back to its original path and thus its transmission cannot resume, and forms a second zero at the second specific frequency.

Preferably, coupling capacitance and coupling inductance are formed between the reference voltage structure and the transmission conductor, and the ground structure forms inductance between the reference voltage structure and the ground layer.

Preferably, the inductor-capacitor oscillating structure undergoes series-connection resonance at a first specific frequency and forms low impedance toward the digital signal such that an unwanted component of the digital signal is guided to the ground voltage, and forms the first zero at the first specific frequency.

Preferably, the inductor-capacitor oscillating structure undergoes parallel-connection resonance at a second specific frequency and forms high impedance toward the digital signal such that an unwanted component of the digital signal is guided to its original path and thus its transmission cannot resume, and forms the second zero at the second specific frequency.

Preferably, the electromagnetic coupling or the transmission line effect formed by the transmission conductor and the reference voltage structure combines with inductance characteristics of the ground structure to cause the noise filtering circuit to form a corresponding zero at one or more specific frequencies.

Preferably, the transmission line characteristics developed by the transmission conductor and the reference voltage structure during the transmission of the digital signal prevents attenuation and loss of the digital signal, such that the passband of the digital signal can be smoothly transmitted.

Preferably, the reference voltage structure is a body having an arcuate surface and formed from conductors.

Preferably, the reference voltage structure is a body having an irregular surface and formed from conductors.

Preferably, a dielectric or ferromagnet layer is disposed between the reference voltage structure and the transmission conductor.

BRIEF DESCRIPTION OF THE DRAWINGS

FIG. 6A is a structural schematic view of a single pattern of the noise filtering circuit according to an embodiment of the present invention;

FIG. 6B is a structural schematic view of a quadruple pattern of the noise filtering circuit according to an embodiment of the present invention;

DETAILED DESCRIPTION OF THE EMBODIMENTS

Figure 1:
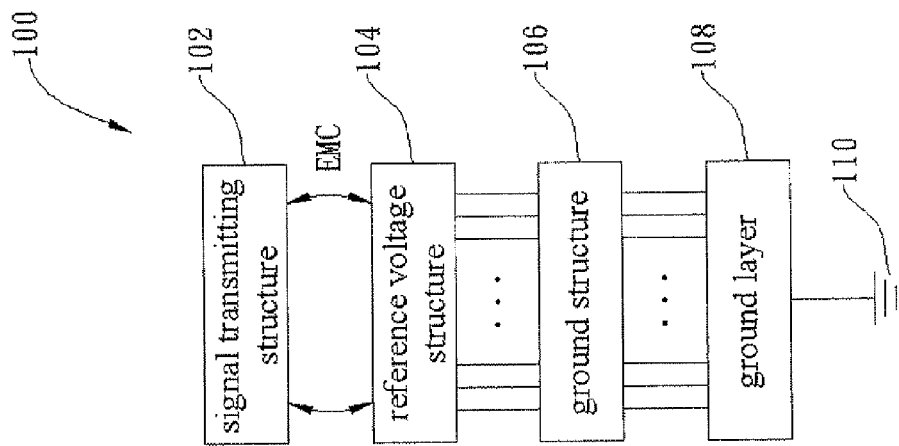
FIG. 1 is a structural schematic view of a noise filtering circuit of the present invention.

Referring to FIG. 1, there is shown a structural schematic view of a noise filtering circuit 100 for suppressing electromagnetic interference (EMI) according to the present invention. As shown in the drawing, the noise filtering circuit 100 for suppressing EMI comprises a signal transmitting structure 102, a reference voltage structure 104, a ground structure 106, and a ground layer 108.

Electromagnetic coupling (EMC) is formed between the signal transmitting structure 102 and the reference voltage structure 104, such that coupling capacitance and coupling inductance are formed between the signal transmitting structure 102 and the reference voltage structure 104. The signal transmitting structure 102 is formed from a transmission conductor. Electromagnetic coupling is formed between the reference voltage structure 104 and the transmission conductor or a transmission line. Hence, coupling capacitance and coupling inductance are present between the reference voltage structure 104 and the transmission conductor or the transmission line.

The reference voltage structure 104 comprises a body which is formed from conductors and takes any shape. For example, the reference voltage structure 104 has a surface which can be flat, arcuate, or wavy, provided that electromagnetic coupling is formed between the reference voltage structure 104 and the signal transmitting structure 102.

The ground structure 106 is electrically connected to the reference voltage structure 104 and the ground layer 108, and forms inductance between the reference voltage structure 104 and the ground layer 108. Of course, within a higher frequency range, the ground structure 106 can also be parallel-connected to multiple parasitic capacitance, so as to enhance the protection for the circuit in its entirety. The ground structure 106 is configured to form an inductor-capacitor oscillating structure in coordination with the coupling capacitance and coupling inductance resulting from the electromagnetic coupling between the reference voltage structure 104 and the signal transmitting structure 102 as well as the inductance of the ground structure 106. Energy is consumed in the ground structure which can be formed from resistors in series or disposed as an integral.

The ground layer 108 is electrically connected to a ground voltage 110.

As described above, the inductor-capacitor oscillating structure of the noise filtering circuit 100 of the present invention undergoes series-connection resonance at a first specific frequency, forms a low impedance zero toward a digital signal, and thus guides the digital signal to the ground voltage 110. Furthermore, the inductor-capacitor oscillating structure undergoes parallel-connection resonance at a second specific frequency and forms high impedance toward the digital signal to thereby cause the digital signal to be reflected and returned to its original path, thereby generating a zero-like response and suppressing the noise of the digital signal.

A point to note is that the first specific frequency and the second specific frequency are either identical or different, depending on the dimensions and characteristics of the constituent elements of the noise filtering circuit 100.

Figure 2A:
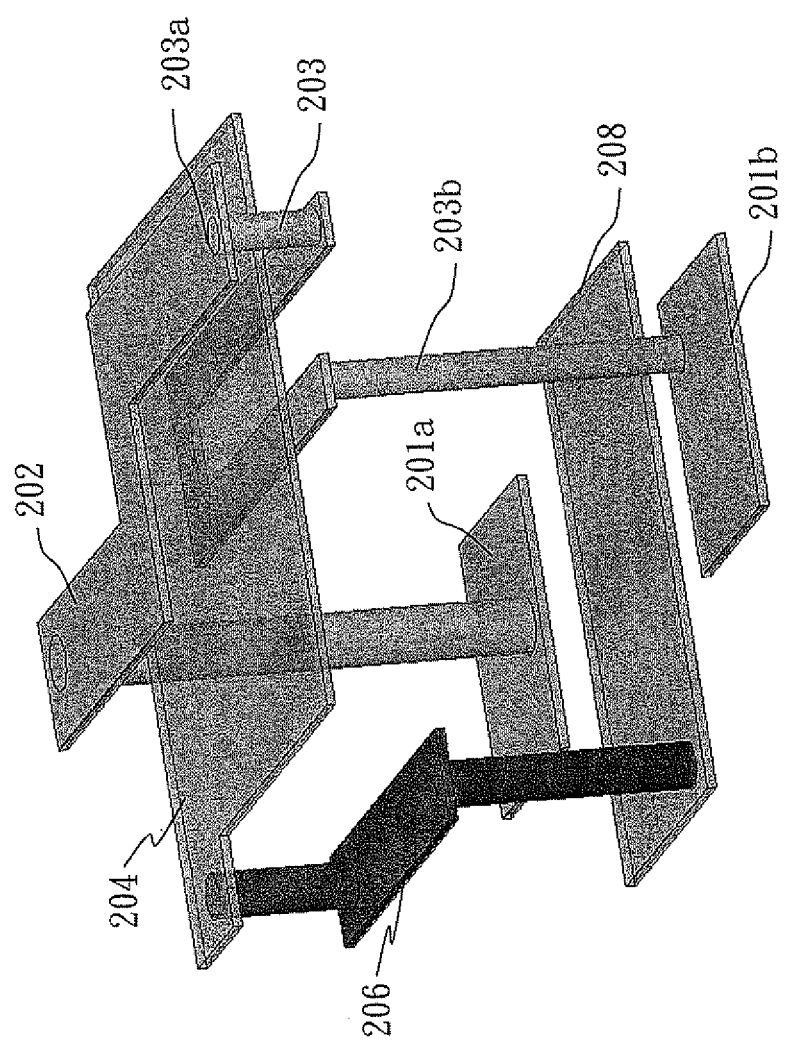
FIG. 2A is a perspective conceptual view of the noise filtering circuit of the present invention.
Figure 2B:
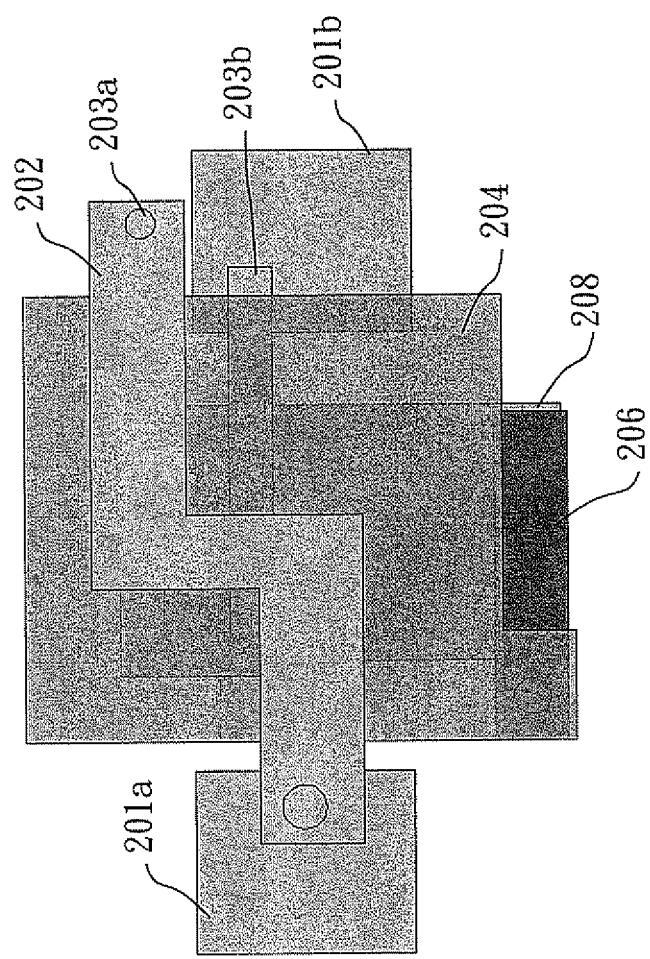
FIG. 2B is a top view of the noise filtering circuit of the present invention.
Figure 2C:
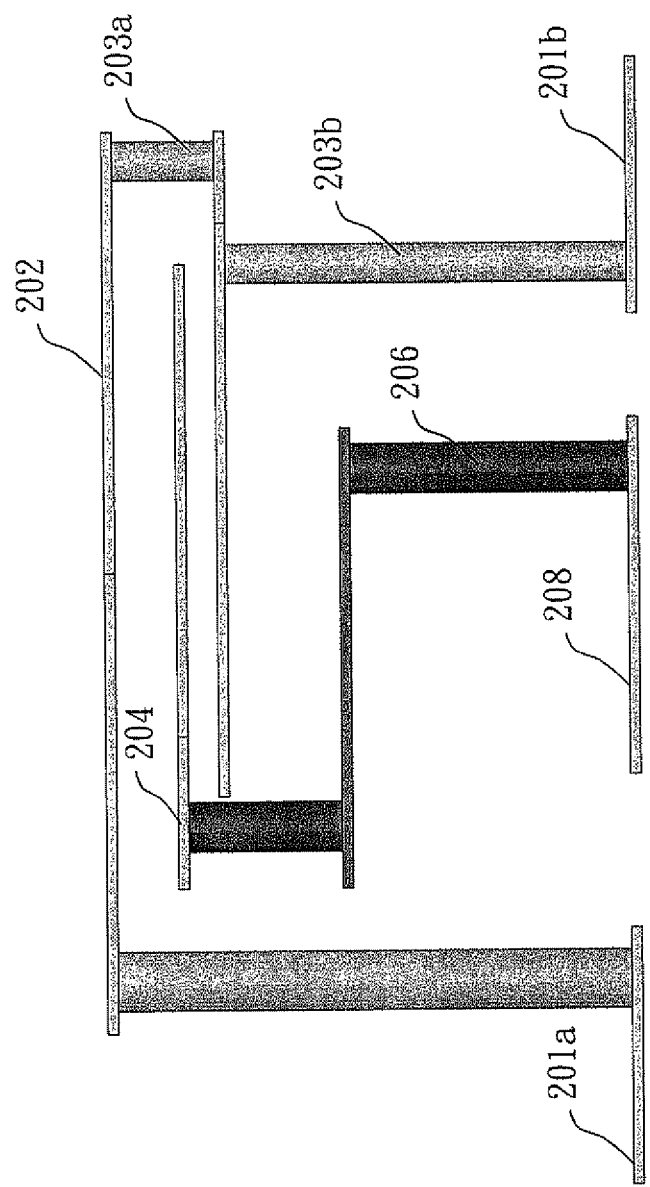
FIG. 2C is a side view of the noise filtering circuit of the present invention.

Refer to FIG. 2A through FIG. 2C for the description below. FIG. 2A is a perspective conceptual view of the noise filtering circuit 100 of the present invention. FIG. 2B is a top view of the noise filtering circuit 100 of the present invention. FIG. 2C is a side view of the noise filtering circuit 100 of the present invention. Referring to FIG. 2A, the noise filtering circuit 100 comprises a signal transmission conductor 202, a reference voltage structure 204, a ground structure 206, and a ground layer 208. The transmission conductor 202 is connected to a digital signal input end 201a and a digital signal output end 201b through via structures, such as conductive vias 203a, 203b.

The reference voltage structure 204 is formed from conductors. In this embodiment, the reference voltage structure 204 is flat, for example. In another embodiment, the reference voltage structure 204 takes any shape.

In this embodiment, the signal transmission conductor 202 is parallel to the reference voltage structure 204 and is adapted to transmit the digital signal, spaced apart from the reference voltage structure 204 by the same distance, and adapted to form electromagnetic coupling (described below) together with the reference voltage structure 204. To transmit the digital signal, the transmission conductor 202 and the reference voltage structure 204 generate electromagnetic coupling, mutual inductance, and mutual capacitance so as to develop transmission line characteristics whereby the passband of the digital signal can be smoothly transmitted while the transmission of the digital signal is accompanied by very low attenuation and loss thereof.

The ground layer 208 is electrically connected to a ground voltage (GND) and is electrically connected to the ground structure 206.

In this embodiment, the ground structure 206 is electrically connected to the reference voltage structure 204 on one side of the transmission conductor 202. The inductance formed by the ground structure 206 can combine with coupling capacitance and coupling inductance which result from electromagnetic coupling between the transmission conductor 202 and the reference voltage structure 204, so as to form the inductor-capacitor oscillating structure.

Depending on a designer's needs, it is feasible to change the capacitance and/or inductance of the capacitive and/or inductive elements in the equivalent circuit, respectively, by adjusting the shape, width, pitch, layout density, and height of the transmission conductor 202 or the width and length of a reference voltage structure. The inductor-capacitor oscillating structure forms a low impedance zero toward the digital signal at a specific frequency, such that the digital signal is guided to the ground voltage. Alternatively, the inductor-capacitor oscillating structure forms high impedance toward the digital signal at a specific frequency, such that the digital signal is guided back to its original path, thereby bringing about a zero-like effect.

As described above, the noise filtering circuit 100 of the present invention suppresses digital noise (i.e., the high multiplied-frequency component of the digital signal) without compromising the transmission of the digital signal. The noise filtering circuit 100 shown in FIG. 2A is depicted as a framework of unit length for an illustrative purpose; in other words, the framework can also be extended and applied to a combination of multiple similar frameworks.

In another embodiment, the transmission conductor 202 can be an intricate symmetrical wire or metal interconnection, whereas the reference voltage structure 204 can be a multi-layer flat panel, an arcuate surface, a wavy surface, or a combination thereof. The ground structure 206 can be implemented by a combination of an intricate conductor structure and conductive vias. The other variant forms or embodiments of the transmission conductor, the reference voltage structure, and the ground structure are described below.

Figure 3B:
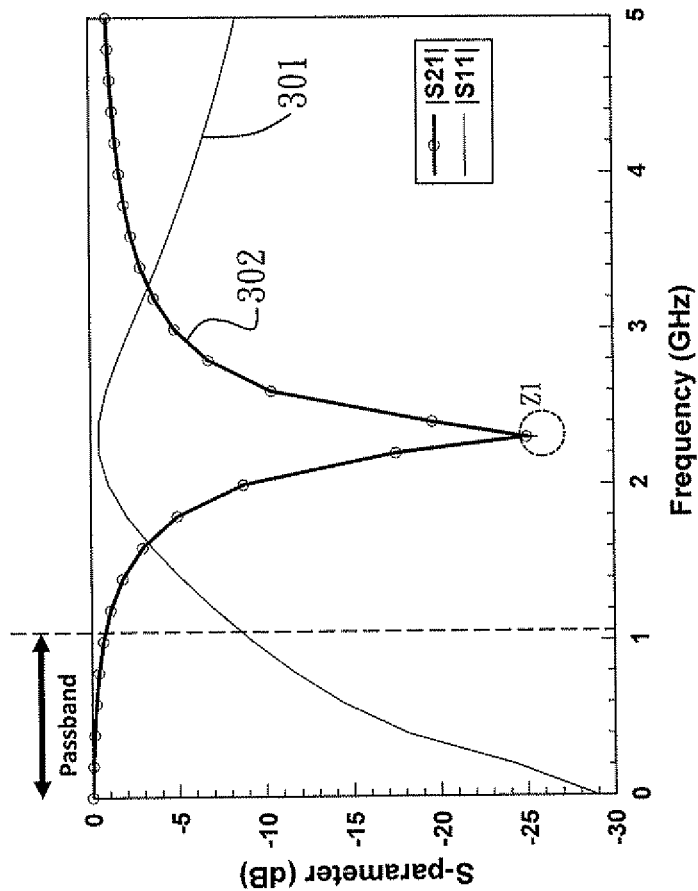
FIG. 3B is a schematic view of a single zero Z1 formed at the noise filtering circuit of the present invention, wherein a curve 301 depicts a return loss of a digital signal being transmitted at different frequencies, and a curve 302 depicts an insertion loss of the digital signal being transmitted at different frequencies.
Figure 3A:
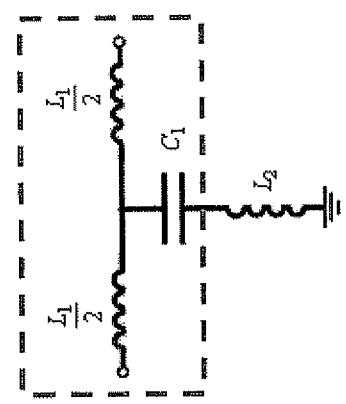
FIG. 3A is a schematic view of a transmission conductor with a low winding density, which is based on a single-zero equivalent circuit of the noise filtering circuit in FIG. 2A.

Referring to FIG. 3A, there is shown a schematic view of a transmission conductor with a low winding density, which is based on a single-zero equivalent circuit of the noise filtering circuit in FIG. 2A. As shown in the drawing, the single-zero equivalent circuit is a first-order equivalent circuit (note: the term "first-order" is used herein to facilitate description, and it means that the transmission line effect is illustrated with a single T-shaped series-L-shunt-C network, and thus the term "first-order" used herein should be distinguished from the jargon "order" used in circuitry; hence, the aforesaid rule also applies to the terms "second-order" and "third-order" used below.) The inductance L1 denotes inductance coupling formed between the transmission conductor and the reference voltage structure. The coupling capacitance C1 denotes capacitance coupling formed between the transmission conductor and the reference voltage structure. The inductance L2 denotes equivalent inductance formed by the ground structure and positioned between the reference voltage structure and the ground layer. The zero of the circuit is located at the series-connection resonance frequency of C1 & L2, which is expressed by:

$$\omega_0 = \frac{1}{\sqrt{L_2 C_1}}$$

Referring to FIG. 3B, there is shown a schematic view of a single zero Z1 formed at the noise filtering circuit 100 of the present invention. The curves 301, 302 depict the digital signal being transmitted at different frequencies. The curve 301 depicts a return loss of the digital signal being transmitted at different frequencies. The curve 302 depicts an insertion loss of the digital signal being transmitted at different frequencies. Hence, the passband component of the digital signal can be transmitted well by means of the noise filtering circuit 100 of the present invention without being affected or suppressed, and resonance zero Z1 can be formed at the noise filtering circuit 100 of the present invention at a specific high frequency.

Figures 4A, 4B:
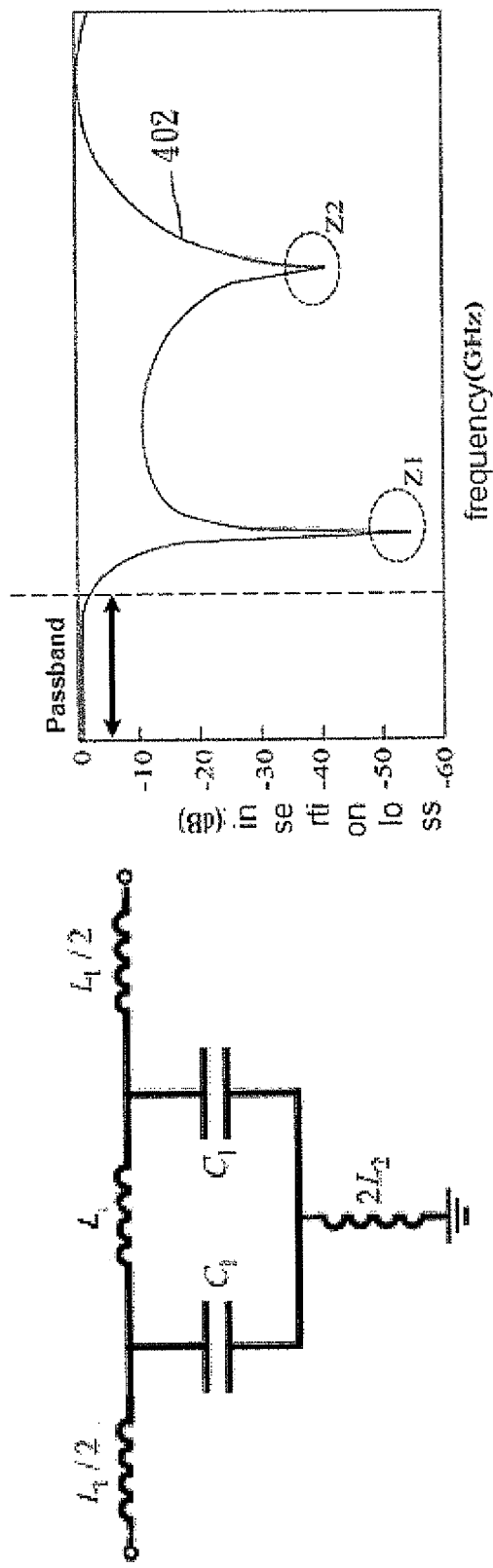
FIG. 4A is a schematic view of a transmission conductor with a higher winding density, which is based on a dual-zero equivalent circuit of the noise filtering circuit in FIG. 2A.
FIG. 4B is a schematic view of two zeros Z1, Z2 formed at the noise filtering circuit of the present invention, wherein a curve 402 depicts the insertion loss of the digital signal being transmitted at different frequencies.

Referring to FIG. 4A, there is shown a schematic view of a transmission conductor with a higher winding density, which is based on a dual-zero equivalent circuit of the noise filtering circuit in FIG. 2A. As shown in the drawing, the dual-zero equivalent circuit is a second-order equivalent circuit. The inductance L1 denotes inductance coupling formed between the transmission conductor and the reference voltage structure. The coupling capacitance C1 denotes capacitance coupling formed between the transmission conductor and the reference voltage structure. The inductance L2 denotes equivalent inductance formed by the ground structure and positioned between the reference voltage structure and the ground layer.

The upper half circuit lies outside the inductance $2L_2$, whereas the lower half circuit is confined to the inductance $2L_2$. The terms "upper half circuit" and "lower half circuit" are used herein to facilitate description of the relative positions of the technical features of the present invention rather than limit the embodiments of the present invention. To figure out a zero of the circuit, it is necessary to calculate the transmission impedance $Z_{21}$ of the circuit. The circuit is divided into the upper half and the lower half which are cascoded, as expressed by:

$$\begin{bmatrix} V_1 \\ V_2 \end{bmatrix} = \begin{bmatrix} V_1^a + V_1^b \\ V_2^a + V_2^b \end{bmatrix} = \begin{bmatrix} Z_{11}^a + Z_{11}^b & Z_{12}^a + Z_{12}^b \\ Z_{21}^a + Z_{21}^b & Z_{22}^a + Z_{22}^b \end{bmatrix} \begin{bmatrix} i_1 \\ i_2 \end{bmatrix}$$

$$Z_{total} = Z_a + Z_b,$$

Its Z matrix equals the sum of its upper Z matrix and lower Z matrix. Hence, $Z_{21}$ of the circuit equals the sum of $Z_{21}$ of the upper half circuit and $Z_{21}$ of the lower half circuit. A zero of the circuit can be figured out by calculating the root of $Z_{21}=0$ From the perspective of the upper half circuit, $$Z_{21\_up} = \frac{1}{2j\omega C_1 - j\omega^3 L_1 C_1^2}$$

From the perspective of the lower half circuit, $$Z_{21\_down} = 2j\omega L_2$$

Make $Z_{21}=Z_{21\_up}+Z_{21\_down}=0$ to obtain the expression below (expression 1):

In general, provide $L_2 > L_1$ to obtain the result below (expression 2):

$$\omega_{z1} \cong \frac{1}{\sqrt{2L_2 C_1}}, \omega_{z2} \cong \frac{1}{\sqrt{L_1 C_1/2}} \quad \text{(expression 2)}$$

$$\omega_{z1,z2} = \sqrt{\frac{1 \pm \sqrt{1 - L_1/2L_2}}{L_1 C_1}} \quad \text{(expression 1)}$$

Figure 4D:
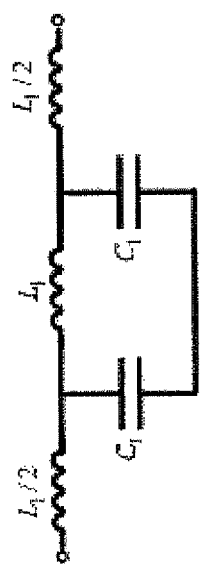
FIG. 4D is a schematic view showing that parallel-connection resonance occurs to the inductor-capacitor oscillating structure of FIG. 4A at the second resonance zero frequency.
Figure 4C:
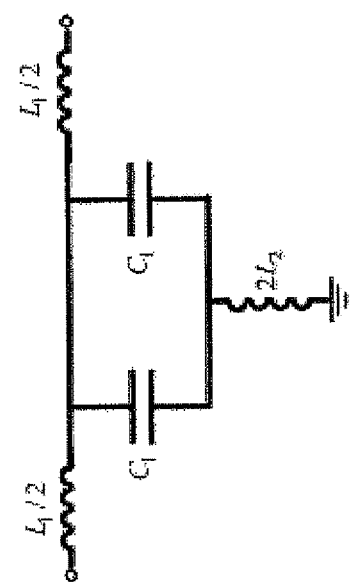
FIG. 4C is a schematic view showing that series-connection resonance occurs to an inductor-capacitor oscillating structure of FIG. 4A at the first resonance zero frequency.

The physical mechanism of a resonance zero disclosed in expression 2 is described below by reference to FIG. 4C and FIG. 4D.

As indicated by expression 2, it is understandable that the first resonance zero is the frequency at which the inductor-capacitor oscillating structure undergoes series-connection resonance. Referring to FIG. 4C, the inductor-capacitor oscillating structure undergoes series-connection resonance at the first resonance zero frequency and forms low impedance toward the digital signal, such that the digital signal is guided to the ground voltage.

As indicated by expression 2, it is understandable that the second resonance zero is the frequency at which the inductor-capacitor oscillating structure undergoes parallel-connection resonance. Referring to FIG. 4D, the inductor-capacitor oscillating structure undergoes parallel-connection resonance at the second resonance zero frequency and forms high impedance toward the digital signal, such that the digital signal is reflected and returned to its original path and thus its transmission cannot resume.

Although the noise suppressing circuit of the present invention can be illustrated with an equivalent circuit of a higher order (such as the third order or the fifth order), an equivalent circuit of a higher order is capable of producing two zeros toward the digital signal and thereby suppressing the noise of the digital signal within the frequency range considered by the present invention. Hence, the analysis of dual-zero circuits of two orders is representative to some extent and thereby simplifies the analysis process.

Referring to FIG. 4B, there is shown a schematic view of two zeros Z1, Z2 formed at the noise filtering circuit 100 of the present invention, wherein the curve 402 depicts the digital signal being transmitted at different frequencies and indicates obviously that the aforesaid resonance zeros Z1, Z2 are formed at specific frequencies without affecting the transmission of the passband of the digital signal. A point to note is that the first resonance zero Z1 and the second resonance zero Z2 are either the same frequency or different frequencies, depending on the dimensions and characteristics of the constituent elements of the noise filtering circuit 100.

Figure 5A:
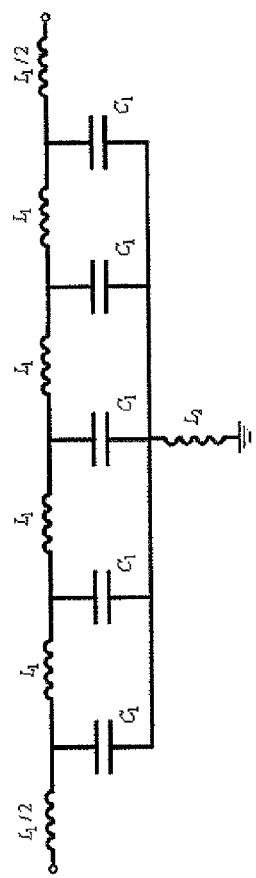
FIG. 5A is a schematic view of a multiple-zero equivalent circuit of the noise filtering circuit in FIG. 2A.
Figure 5B:
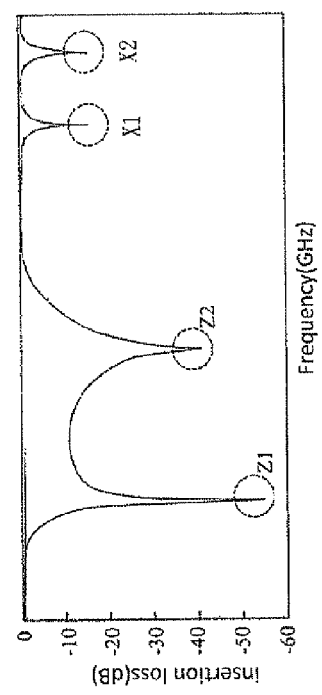
FIG. 5B is a schematic view of additional zeros X1, X2 that occurs to a transmission line structure formed from a transmission conductor structure of the noise filtering circuit of the present invention at a high specific frequency because the transmission line effect or the electromagnetic coupling effect combines with the inductance effect of a ground structure.

Referring to FIG. 5A, there is shown a schematic view of a multiple-zero equivalent circuit of the noise filtering circuit 100 in FIG. 2A. Referring to FIG. 5B, there is shown a schematic view of multiple zeros Z1, Z2, X1 and X2 formed at the noise filtering circuit 100 of the present invention.

As indicated by the aforesaid drawings, it is understandable that the resonance zeros are the frequencies at which the inductor-capacitor oscillating structure undergoes resonance and forms high or low impedance toward an unwanted component (i.e., the high multiplied-frequency component) of the digital signal, such that the high multiplied-frequency component of the digital signal is guided to the ground voltage or reflected and returned to its original path, thereby achieving the filtration effect.

The transmission conductor structure provided in the noise filtering circuit of the present invention and characterized by transmission line characteristics generates the zero-like phenomenon at one or more specific frequencies when subjected to the electromagnetic coupling effect or the transmission line effect, coupled with the inductance effect of a ground structure, at a high frequency. The zero-like phenomenon is likely to result in a zero wanted by the present invention. However, physical principles are not identical in practice, and the details of electromagnetic coupling effect and the transmission line effect are not described herein for the sake of brevity. FIG. 5B is a schematic view of zeros X1, X2 that occurs to a transmission line structure formed from the noise filtering circuit of the present invention at a higher specific frequency because the transmission line effect or the electromagnetic coupling effect combines with the inductance effect of the ground structure (that is, mainly the effect of a combination of the inductance of the ground structure and the equivalent capacitance parallel-connected thereto.) Unlike FIG. 4B, FIG. 5B shows that, for example, two additional zeros X1, X2, more than two substantive zeros, or any number of substantive zeros can be formed at a higher frequency, depending on the characteristics of the transmission line or the characteristics of the transmission conductor. As described above, the zero-like phenomenon arises from the transmission line effect or the electromagnetic coupling effect of the transmission line structure, and thus the two additional zeros X1, X2 are different from the resonance zeros Z1, Z2 of the present invention.

Referring to FIG. 6A, there is shown a structural schematic view of a single pattern of the noise filtering circuit 100 according to an embodiment of the present invention. As shown in the drawing, reference voltage structures 604 are disposed and integrated with the transmission conductor 602, respectively. The reference voltage structures 604 are electrically connected to a ground layer 608 via a ground structure 606. Referring to FIG. 6B, there is shown a structural schematic view of a quadruple pattern of the noise filtering circuit 100 according to an embodiment of the present invention. As shown in FIG. 6B, the number of the noise filtering circuit 100 of FIG. 6A increases to four, and four said noise filtering circuits 100 line up in a quadruple pattern. The four noise filtering circuits 100 of FIG. 6B share the ground layer 608. Hence, different combinations and variations can occur to the noise filtering circuit of the present invention as shown in FIG. 2. To meet a designer's needs, it is feasible to combine multiple unit-length structures at different relative positions, so as to bring about a desirable digital noise filtration effect.

Figure 7:
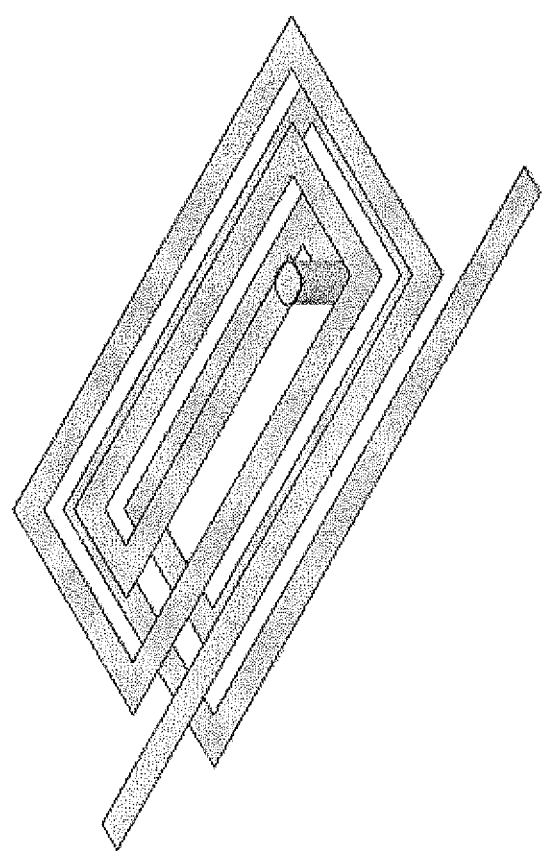
FIG. 7 is a schematic view of the first embodiment of a signal transmitting structure according to the present invention.
Figure 8:
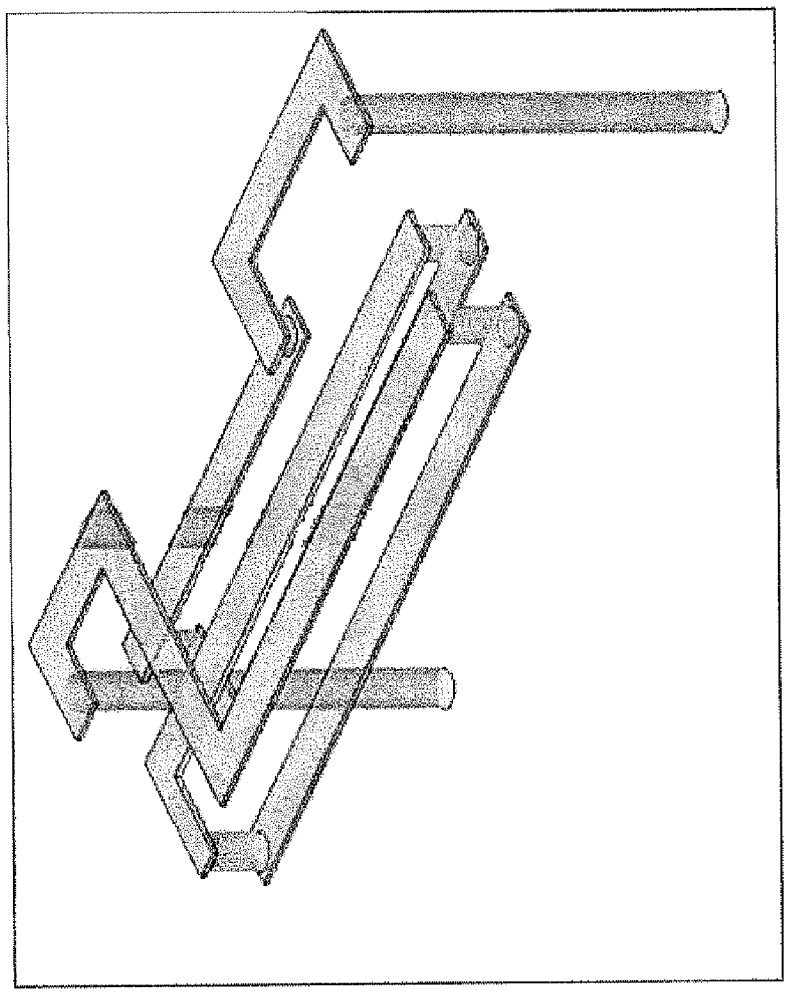
FIG. 8 is a schematic view of the second embodiment of the signal transmitting structure according to the present invention.
Figure 9:
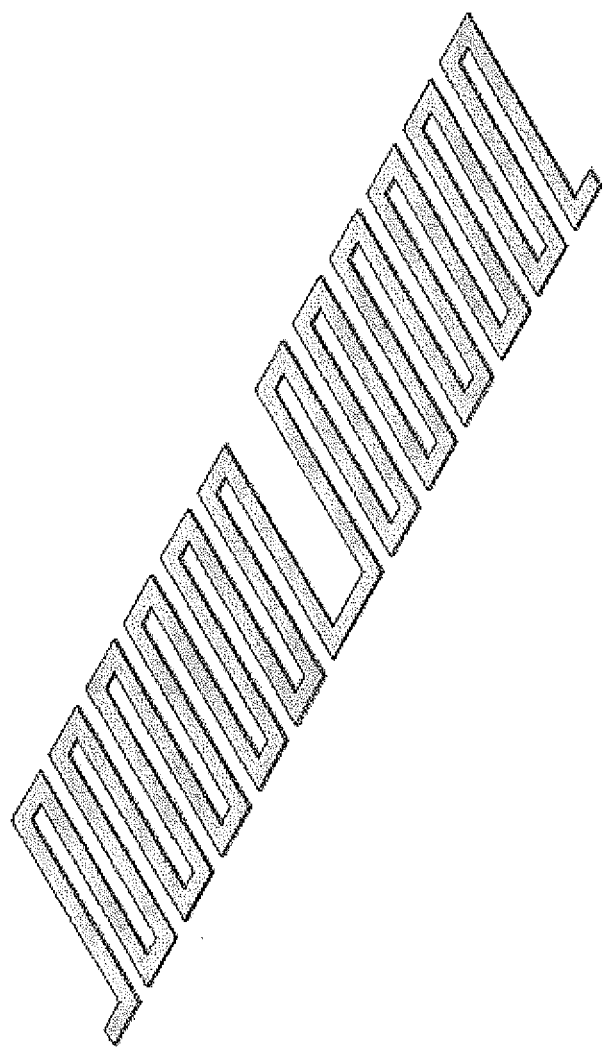
FIG. 9 is a schematic view of the third embodiment of the signal transmitting structure according to the present invention.
Figure 10:
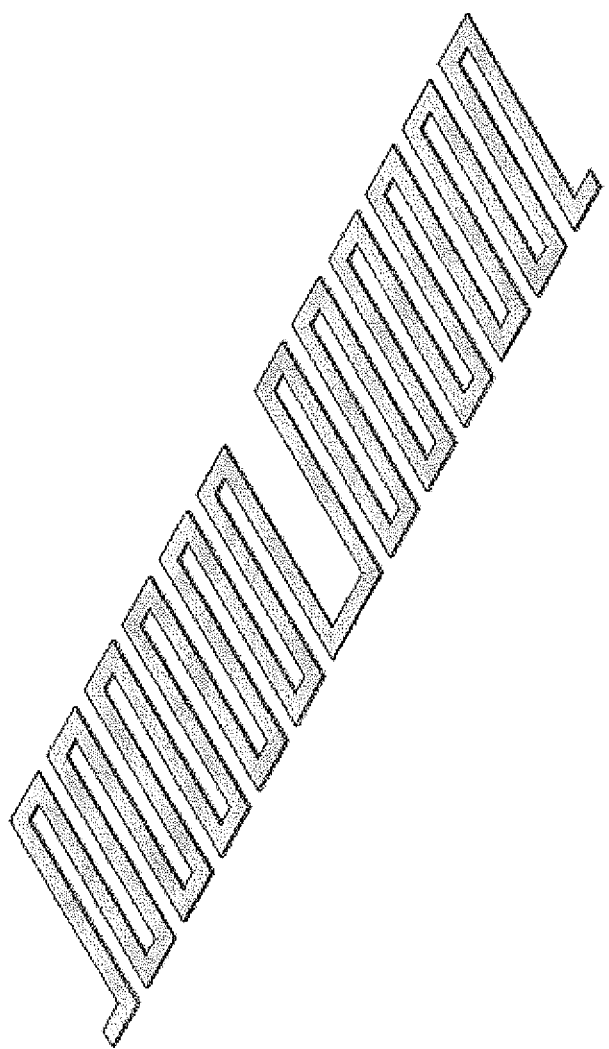
FIG. 10 is a schematic view of the first embodiment of a reference voltage structure according to the present invention.
Figure 11:
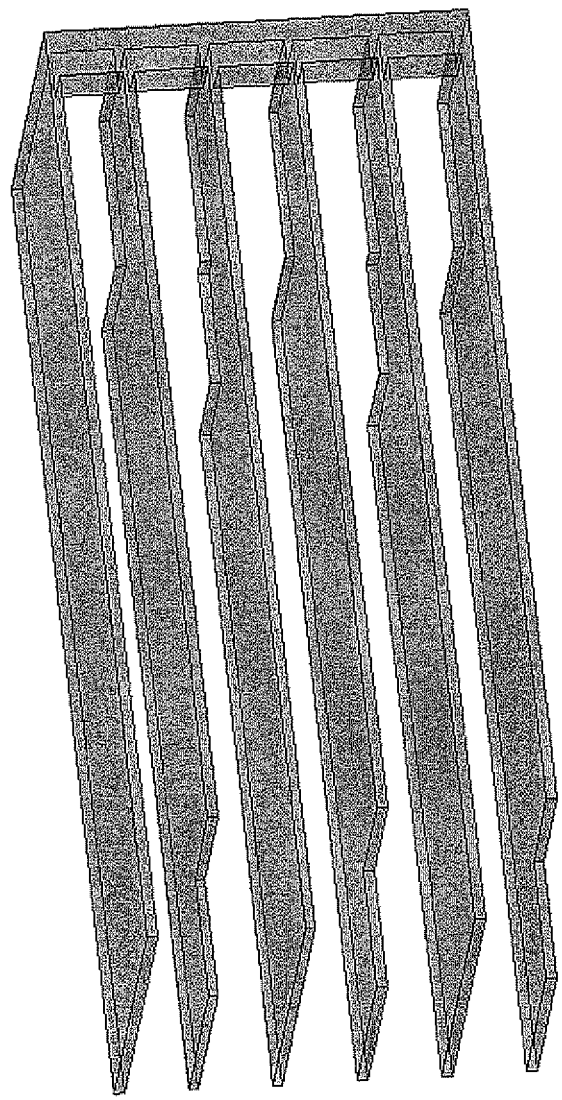
FIG. 11 is a schematic view of the second embodiment of the reference voltage structure according to the present invention.
Figure 12:
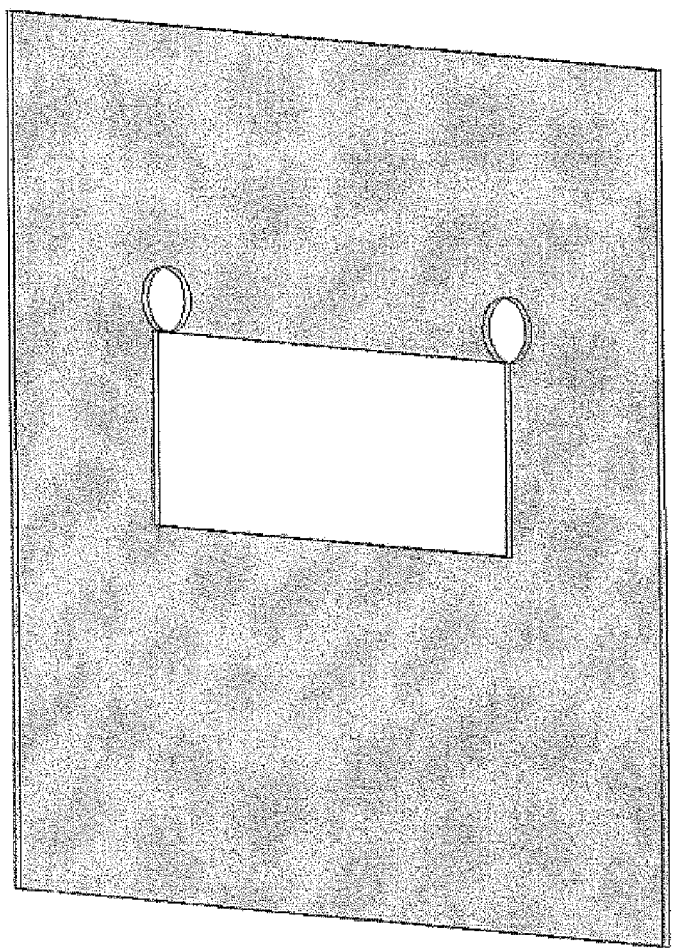
FIG. 12 is a schematic view of the third embodiment of the reference voltage structure according to the present invention.
Figure 13:
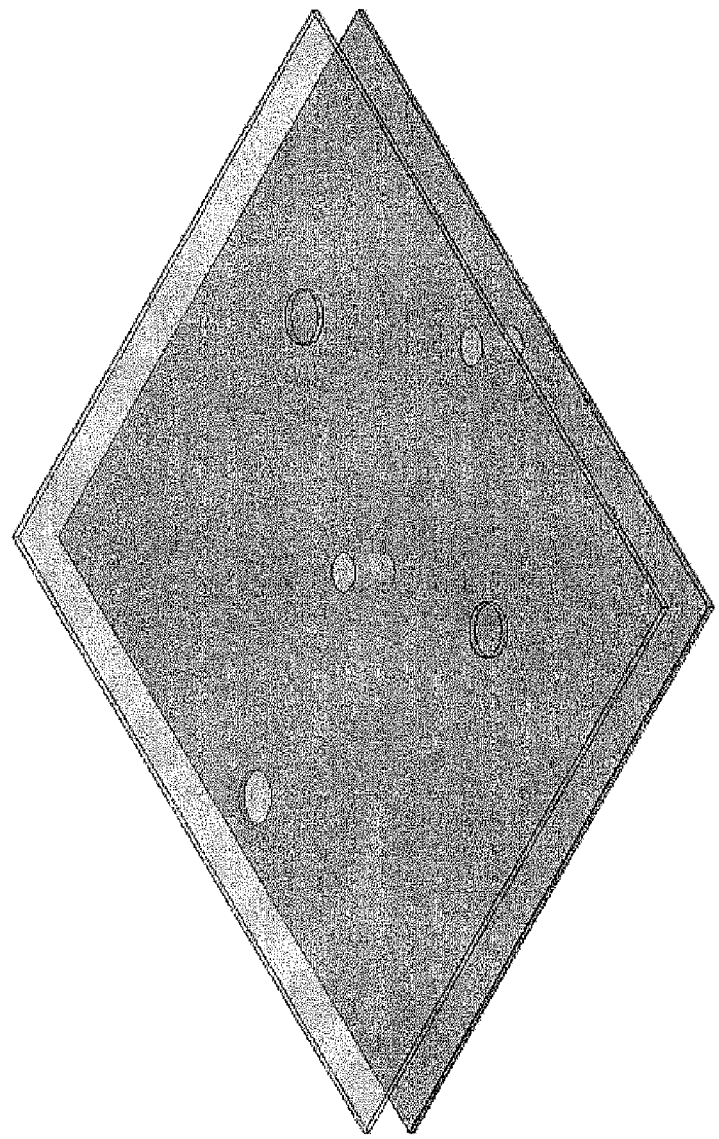
FIG. 13 is a schematic view of the fourth embodiment of the reference voltage structure according to the present invention.
Figure 14:
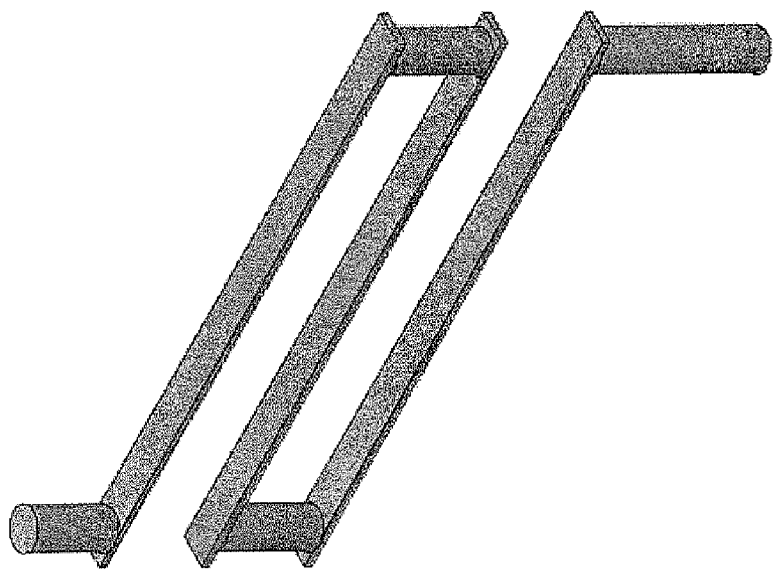
FIG. 14 is a schematic view of the first embodiment of a ground structure according to the present invention.
Figure 15:
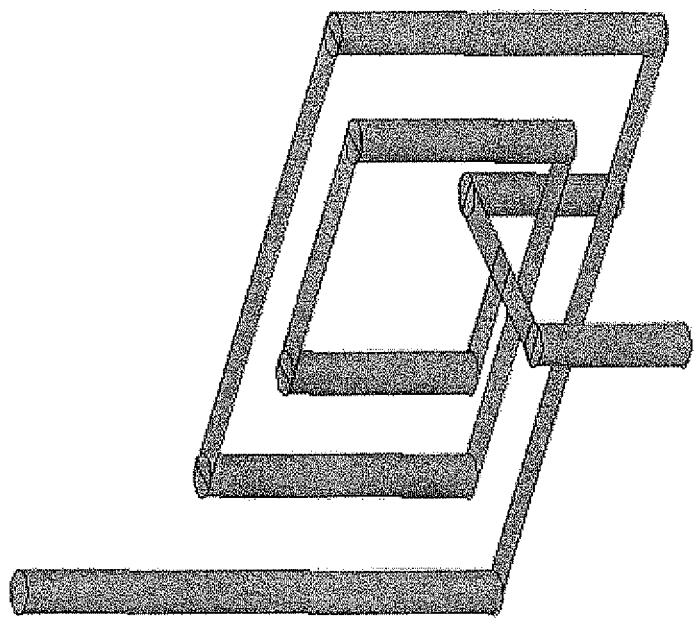
FIG. 15 is a schematic view of the second embodiment of the ground structure according to the present invention.
Figure 16:
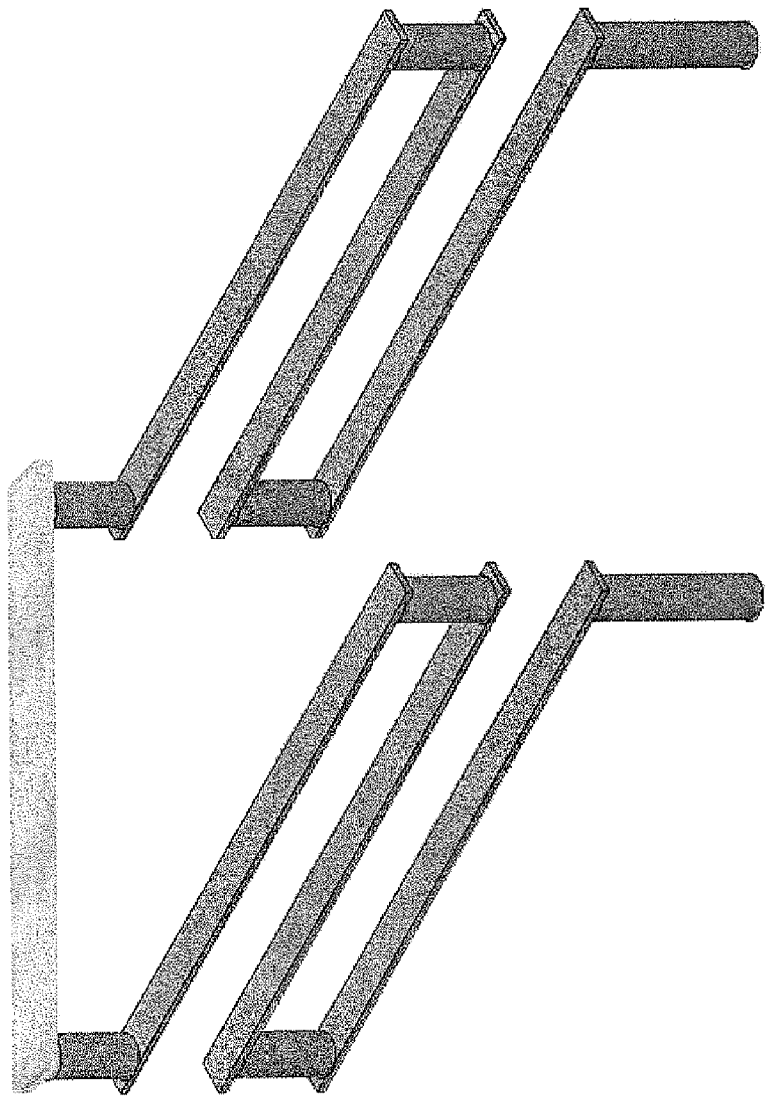
FIG. 16 is a schematic view of the third embodiment of the ground structure according to the present invention.

The shapes or dimensions disclosed by the aforesaid embodiments are not restrictive of the constituent elements of the noise filtering circuit of the present invention. Referring to FIGS. 7, 8, 9, there are shown schematic views of embodiments of signal transmitting structures. Referring to FIGS. 10, 11, 12, 13, there are shown schematic views of embodiments of reference voltage structures. Referring to FIGS. 14, 15, 16, there are shown schematic views of embodiments of ground structures.

As indicated above, a noise filtering circuit of the present invention filters out high frequency multiplied noise of a digital signal without compromising the quality of the digital signal, enhances miniaturization of the noise filtering circuit, is applicable to printed circuit boards, offers a high-performance and cost-efficient solution of noise filtration, and thus overcomes the drawbacks of the prior art, such as narrow application and high design costs.

The embodiments described above are illustrative of the principles and benefits of the present invention, but are not restrictive of the present invention. Hence, persons skilled in the art can modify and change the aforesaid embodiments without contradicting the spirit and scope of the present invention. Accordingly, the legal protection for the present invention should be defined by the appended claims.

What is claimed is:

1. A noise filtering circuit for filtering out high frequency multiplied noise during transmission of a digital signal, the noise filtering circuit comprising:
   a reference voltage structure formed from conductors;
   a transmission conductor adapted to transmit the digital signal, combined with the reference voltage structure to effectuate electromagnetic coupling, thereby developing transmission line characteristics during the transmission of the digital signal to allow the signal transmission to remain unaffected;
   a ground layer electrically connected to a ground voltage; and
   a ground structure electrically connected to the reference voltage structure and the ground layer, wherein the electromagnetic coupling between the reference voltage structure and the transmission conductor, and an inductance of the ground structure all collectively form an inductor-capacitor oscillating structure, so as to perform noise filtration on the digital signal at a specific frequency and enable transmission of a passband of the digital signal;
   wherein the inductor-capacitor oscillating structure undergoes series-connection resonance at a first specific frequency and forms a low impedance toward an unwanted component of the digital signal such that the unwanted component of the digital signal is guided to the ground voltage, and forms a first zero at the first specific frequency.

2. The noise filtering circuit of claim 1, wherein a coupling capacitance and a coupling inductance is formed between the reference voltage structure and the transmission conductor, and the ground structure is formed between the reference voltage structure and the ground layer.

3. The noise filtering circuit of claim 1, wherein the ground structure consumes energy.

4. The noise filtering circuit of claim 3, wherein the ground structure is formed from resistors in series.

5. The noise filtering circuit of claim 1, wherein the electromagnetic coupling or the transmission line characteristics formed by the transmission conductor and the reference voltage structure combines with the inductance of the ground structure to cause the noise filtering circuit to form the first zero at the first frequency and/or a corresponding zero at one or more other specific frequencies.

6. The noise filtering circuit of claim 1, wherein the transmission line characteristics developed by the transmission conductor and the reference voltage structure during the transmission of the digital signal prevents attenuation and loss of the digital signal and ensures smooth transmission thereof.

7. The noise filtering circuit of claim 1, wherein a main body of the reference voltage structure has an arcuate surface.

8. The noise filtering circuit of claim 1, wherein a main body of the reference voltage structure has an irregular surface.

9. The noise filtering circuit of claim 1, wherein a dielectric or ferromagnetic layer is disposed between the reference voltage structure and the transmission conductor.

10. The noise filtering circuit of claim 1, wherein the reference voltage structure comprises multi-layer conductors; and a main body of the reference voltage structure is formed from the multi-layer conductors connected through vias.

11. The noise filtering circuit of claim 10, wherein the transmission conductor is disposed above a top layer of the reference voltage structure, below a bottom layer of the reference voltage structure, or between at least two of the multi-layer conductors of the reference voltage structure with electricity conducted therein.

12. A noise filtering matrix composed of a plurality of the noise filtering circuit of claim 1, wherein the ground layer of each noise filtering circuit is interconnected with all of the other ground layers within the noise filtering matrix.

13. A noise filtering circuit for filtering out high frequency multiplied noise during transmission of a digital signal, the noise filtering circuit comprising:
   a reference voltage structure formed from conductors;
   a transmission conductor adapted to transmit the digital signal, combined with the reference voltage structure to effectuate electromagnetic coupling, thereby developing transmission line characteristics during the transmission of the digital signal to allow transmission of a passband of the digital signal to remain unaffected;
   a ground layer electrically connected to a ground voltage; and a ground structure electrically connected to the reference voltage structure and the ground layer, wherein the electromagnetic coupling between the reference voltage structure and the transmission conductor, and an inductance of the ground structure all collectively form an inductor-capacitor oscillating structure, so as to perform noise filtration on the digital signal at a specific frequency and enable the transmission of the passband of the digital signal, wherein the inductor-capacitor oscillating structure undergoes series-connection resonance at a first specific frequency and forms a low impedance toward an unwanted component of the digital signal such that the unwanted component of the digital signal is guided to the ground voltage, and forms a first zero at the first specific frequency, wherein the inductor-capacitor oscillating structure undergoes parallel-connection resonance at a second specific frequency and forms a high impedance toward an unwanted component of the digital signal such that the unwanted component of the digital signal is guided back to an original path and thus is prevented from being transmitted, and forms a second zero at the second specific frequency.

14. The noise filtering circuit of claim 13, wherein the ground structure consumes energy.

15. The noise filtering circuit of claim 14, wherein the ground structure is formed from resistors in series.

16. The noise filtering circuit of claim 13, wherein a coupling capacitance and a coupling inductance is formed between the reference voltage structure and the transmission conductor, and the ground structure is formed between the reference voltage structure and the ground layer.

17. The noise filtering circuit of claim 13, wherein the electromagnetic coupling or the transmission line characteristics formed by the transmission conductor and the reference voltage structure combines with the inductance of the ground structure to cause the noise filtering circuit to form the first zero at the first frequency, the second zero at the second frequency, and/or a corresponding zero at one or more other specific frequencies.

18. The noise filtering circuit of claim 13, wherein the transmission line characteristics developed by the transmission conductor and the reference voltage structure during the transmission of the digital signal prevents attenuation and loss of the digital signal and ensures smooth transmission thereof.

19. The noise filtering circuit of claim 13, wherein a main body of the reference voltage structure has an arcuate surface.

20. The noise filtering circuit of claim 13, wherein a main body of the reference voltage structure has an irregular surface.

21. The noise filtering circuit of claim 13, wherein a dielectric or ferromagnetic layer is disposed between the reference voltage structure and the transmission conductor.

22. The noise filtering circuit of claim 13, wherein the reference voltage structure comprises multi-layer conductors; and a main body of the reference voltage structure is formed from the multi-layer conductors connected through vias.

23. The noise filtering circuit of claim 13, wherein the transmission conductor is disposed above a top layer of the reference voltage structure, below a bottom layer of the reference voltage structure, or between at least two of the multi-layer conductors of the reference voltage structure with electricity conducted therein.

24. A noise filtering matrix composed of a plurality of the noise filtering circuit of claim 13, wherein the ground layer of each noise filtering circuit is interconnected with all of the other ground layers within the noise filtering matrix.

* * * * *